(12) United States Patent
Shiraishi

(10) Patent No.: US 12,431,421 B2
(45) Date of Patent: Sep. 30, 2025

(54) SEMICONDUCTOR DEVICE

(71) Applicant: Mitsubishi Electric Corporation, Tokyo (JP)

(72) Inventor: Takuya Shiraishi, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 579 days.

(21) Appl. No.: 17/934,943

(22) Filed: Sep. 23, 2022

(65) Prior Publication Data

US 2023/0178471 A1 Jun. 8, 2023

(30) Foreign Application Priority Data

Dec. 7, 2021 (JP) ................... 2021-198270

(51) Int. Cl.
*H01L 23/498* (2006.01)
*H01L 23/544* (2006.01)

(52) U.S. Cl.
CPC ...... *H01L 23/49844* (2013.01); *H01L 23/544* (2013.01); *H01L 2223/54433* (2013.01)

(58) Field of Classification Search
CPC .................. H01L 23/49844; H01L 23/544
See application file for complete search history.

(56) References Cited

U.S. PATENT DOCUMENTS

| 2003/0075783 | A1* | 4/2003 | Yoshihara | ......... H01L 23/49575 |
| | | | | 257/E23.092 |
| 2017/0033705 | A1* | 2/2017 | Nakamura | ......... H10D 62/8325 |
| 2021/0143088 | A1* | 5/2021 | Kamiya | ............ H01L 23/49537 |

FOREIGN PATENT DOCUMENTS

| JP | S61-101062 A | 5/1986 | |
| JP | 2004063688 A | * 2/2004 | ....... H01L 23/49541 |
| JP | 2009-111154 A | 5/2009 | |
| JP | 2011-029402 A | 2/2011 | |

* cited by examiner

*Primary Examiner* — Jeff W Natalini
*Assistant Examiner* — Rose Keagy
(74) *Attorney, Agent, or Firm* — Studebaker Brackett PLLC

(57) ABSTRACT

A semiconductor device includes a package, a control terminal group including at least three control terminals inputting a control signal to a semiconductor element and projecting from a side surface of a first side out of the first side and a second side opposite to the first side of the package, and a main terminal group including at least three main terminals energizing the semiconductor element with a main current and projecting from a side surface of the second side. Middle portions of the two respective terminals of the control terminal group and the main terminal group are provided with stoppers for preventing over-insertion into the substrate. A middle portion of at least one terminal of at least any one of the terminal groups of the control terminal group and the main terminal group is provided with stoppers for identifying a rated current of the semiconductor device.

9 Claims, 11 Drawing Sheets

F I G. 1
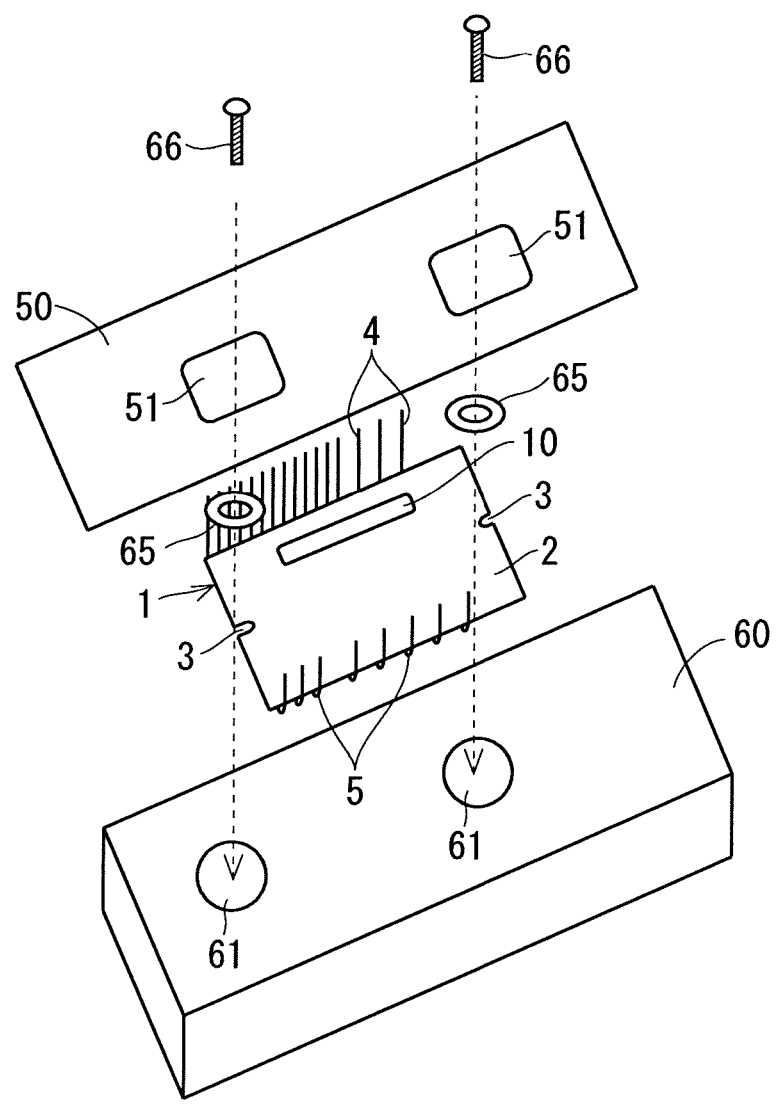

F I G. 5
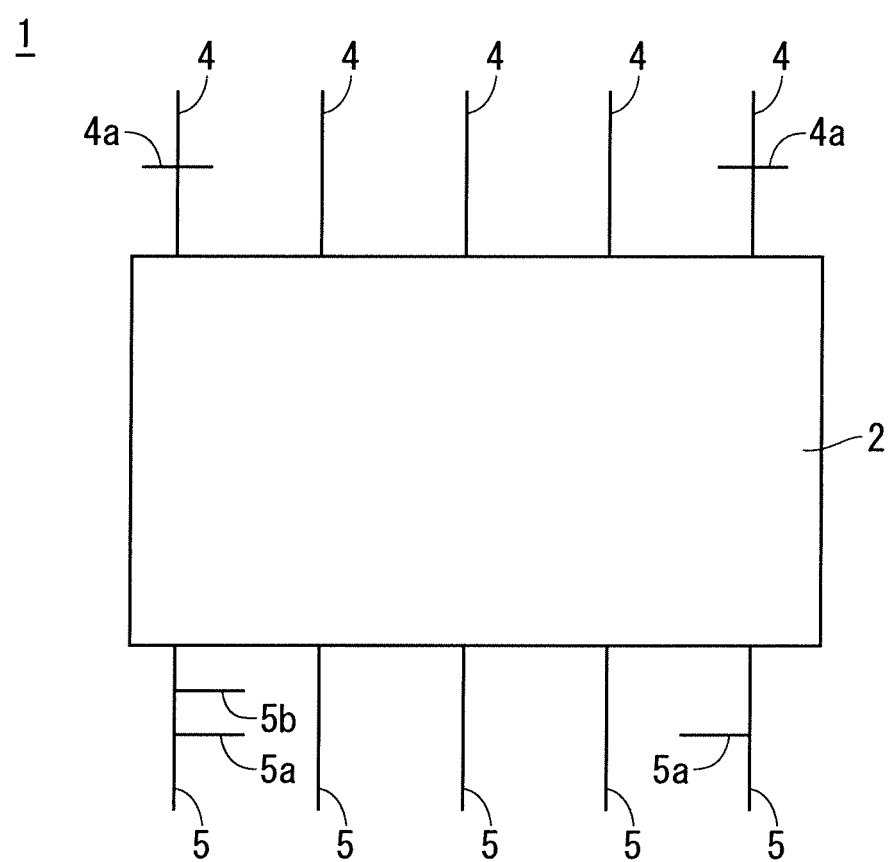

F I G. 7
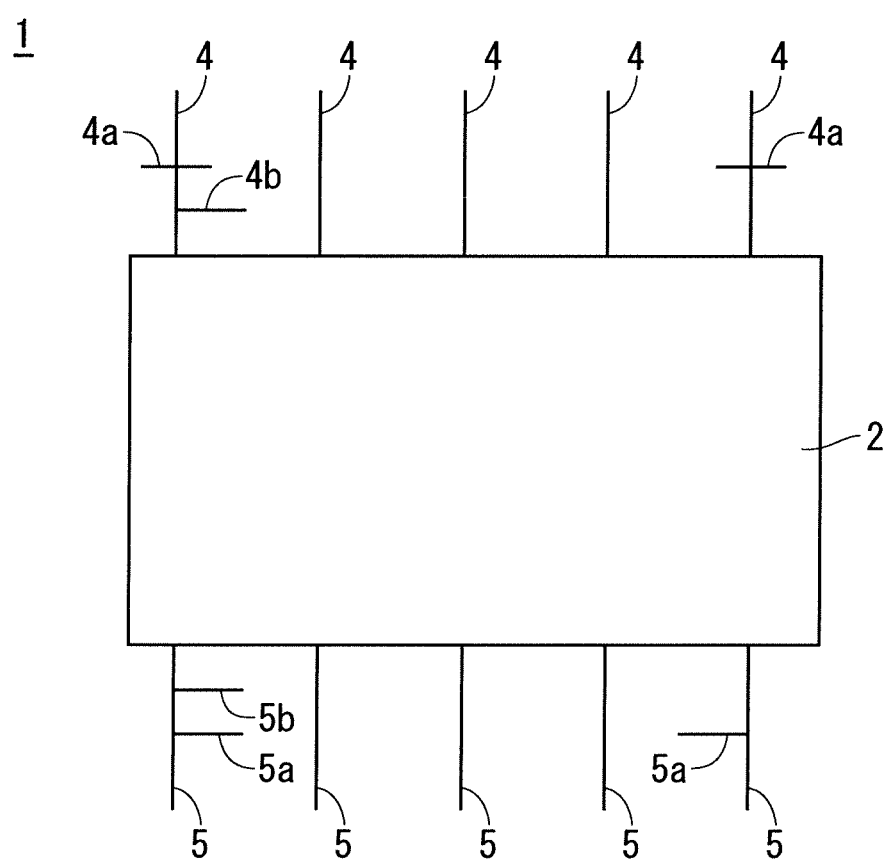

SEMICONDUCTOR DEVICE

BACKGROUND OF THE INVENTION

Field of the Invention

The present disclosure relates to a semiconductor device.

Description of the Background Art

Conventionally, when a semiconductor device is mounted on a substrate, stoppers are provided on control terminals and main terminals so that the control terminals and the main terminals provided in the semiconductor device are not over-inserted. The stoppers are provided on the control terminals and main terminals located at the four corners of the semiconductor device (see, for example, Japanese Patent Application Laid-Open No. 2009-111154).

In a semiconductor device, due to the internal structure thereof, in order to improve the heat radiation of the semiconductor element, heat radiation fins larger than the size of the semiconductor device are mounted on a package surface on the side opposite to the direction in which the terminals are bent. Further, the model name is printed on the package surface in the direction in which the terminals are bent.

However, in a state in which the semiconductor device is mounted on the substrate, the package surface in the direction in which the terminal is bent comes into contact with the substrate. Therefore, in order to confirm the model name after mounting the semiconductor device, the semiconductor device needs to be removed from the substrate.

In particular, when the outer shapes of a plurality of semiconductor devices are the same and only the rated currents are different, identifying the rated current by visually inspecting the outer shape is difficult. Therefore, identifying the rated current involves the above-mentioned removal work, causing a concern that the production efficiency may be lowered.

SUMMARY

An object of the present disclosure is to provide a technique capable of identifying the rated current of a semiconductor device with facility.

The semiconductor device of the present disclosure is a semiconductor device to be mounted on a substrate. The semiconductor device includes a package having a rectangular shape in top view, a control terminal group, and a main terminal group. The package seals a semiconductor element. The control terminal group includes at least three control terminals inputting a control signal to the semiconductor element and projecting from a side surface of a first side out of the first side and the second side opposite to the first side of the package. The main terminal group includes at least three main terminals energizing the semiconductor element with the main current and projecting from the side surface of the second side. The middle portions of the two respective terminals of the control terminal group and the main terminal group are provided with the first stoppers for preventing over-insertion into the substrate. A middle portion of at least one terminal of at least any one of the terminal groups of the control terminal group and the main terminal group is provided with a second stopper for identifying a rated current of the semiconductor device.

Facilitated identification of the rated current of the semiconductor device is ensured without removing the semiconductor device from the substrate by making the number of stoppers different for each rated current of the semiconductor device.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is an exploded perspective view of an inverter system including a semiconductor device, heat radiation fins, and a substrate according to a first embodiment as viewed from the bottom surface side;

FIG. 5 is a plan view illustrating an example of a semiconductor device according to a second embodiment before bending;

FIG. 7 is a plan view illustrating yet another example of the semiconductor device according to the second embodiment before bending;

DESCRIPTION OF THE PREFERRED EMBODIMENTS

First Embodiment

Overall Configuration

Figure 2:
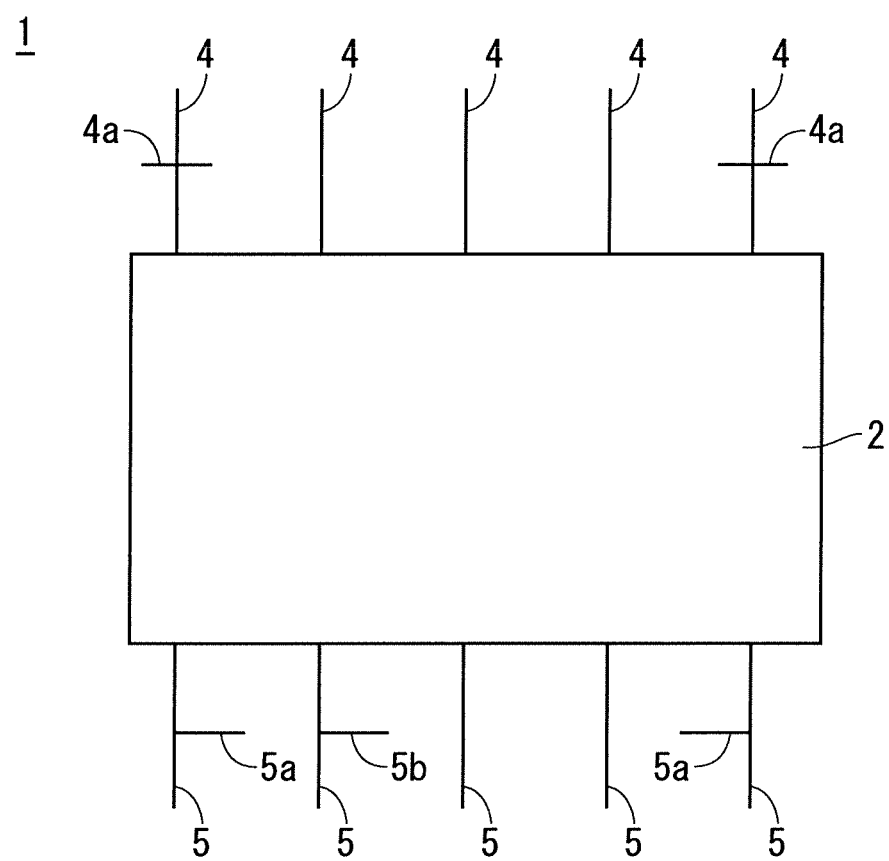
FIG. 2 is a plan view illustrating an example of the semiconductor device according to the first embodiment before bending.

The first embodiment will be described below with reference to the drawings. FIG. 1 is an exploded perspective view of an inverter system including a semiconductor device 1, heat radiation fins 60, and a substrate 50 according to the first embodiment as viewed from the bottom surface side. FIG. 2 is a plan view illustrating an example of the semiconductor device 1 according to the first embodiment before bending.

As illustrated in FIG. 1, the inverter system includes the semiconductor device 1, the heat radiation fins 60, and the substrate 50.

Configuration of Semiconductor Device

As illustrated in FIGS. 1 and 2, the semiconductor device 1 includes a package 2, a plurality of control terminals 4, and a plurality of main terminals 5. The package 2 is formed in a rectangular shape in plan view, and seals a semiconductor element (not illustrated) and an internal circuit (not illustrated). The package 2 is formed of a thermosetting resin such as an epoxy resin.

The plurality of control terminals 4 input a control signal to the semiconductor element and project from a side surface of a first side of the package 2 of the first side and a second side opposite to the first side of the package 2. The plurality of control terminals 4 include at least three control terminals 4 and correspond to a control terminal group.

The plurality of main terminals 5 energize the semiconductor element with the main current and project from the side surface of the second side of the package 2. The plurality of main terminals 5 include at least three main terminals 5 and correspond to a main terminal group.

The plurality of control terminals 4 and the plurality of main terminals 5 are bent toward the bottom surface side of the package 2, that is, the substrate 50 side, and are inserted into holes (not illustrated) of the substrate 50. In this state, the upper surface of the package 2 and the heat radiation fins 60 are brought into contact with each other, and positions of two mounting opening holes 51 provided on the substrate 50, positions of two mounting holes 3 provided on the package 2, and positions two screw mounting holes 61 provided on the heat radiation fins 60 are respectively aligned. The two mounting screws 66 are attached to the two mounting opening holes 51 via two washers 65, two mounting holes 3, and two screw mounting holes 61, respectively, so that the substrate 50 and the heat dissipation fins 60 are attached to the semiconductor device 1.

As illustrated in FIG. 2, middle portions of the two control terminals 4 arranged at both ends of the first side of the package 2 of the plurality of control terminals 4 are provided with stoppers 4a for preventing over-insertion. A stopper 4a projects from the middle portion of the control terminal 4 in two directions, one toward the adjacent control terminal 4 and the other toward the opposite thereof, to prevent over-insertion when the semiconductor device 1 is mounted on the substrate 50.

A middle portion of the two main terminals 5 arranged at both ends of the second side of the package 2 of the plurality of main terminals 5 are provided with stoppers 5a for preventing over-insertion. A stopper 5a projects from the middle portion of the main terminal 5 toward the adjacent main terminal 5 to prevent over-insertion when the semiconductor device 1 is mounted on the substrate 50. Here, the stoppers 4a and 5a correspond to first stoppers.

At least one main terminal 5 not provided with the stopper 5a of the plurality of main terminals 5 is provided with a stopper 5b for identifying the rated current of the semiconductor device 1. The stopper 5b projects from the middle portion of the main terminal 5 to the adjacent main terminal 5.

The plurality of main terminals 5 are provided with two stoppers 5a and one stopper 5b, namely, the three stoppers 5a and 5b are provided in total. In this manner, a total of three stoppers 5a and 5b represent a 5 A rated product. If two stoppers 5b are provided, the total number of stoppers 5a and 5b is four, and the four stoppers 5a and 5b represent 10 A rated products. The difference of the number of stoppers 5a and 5b provided on the main terminals 5 for each rated current allows identification of the rated current of the semiconductor device 1 by checking the number of stoppers 5a and 5b.

A second stopper may be provided not on the main terminal 5 but on at least one control terminal 4 of the plurality of control terminals 4 to which the stoppers 4a are not provided, or on at least one control terminal 4 to which the stopper 4a is not provided and at least one main terminal 5 to which the stopper 5a is not provided of the plurality of control terminals 4 and the plurality of main terminals 5.

Figure 3:
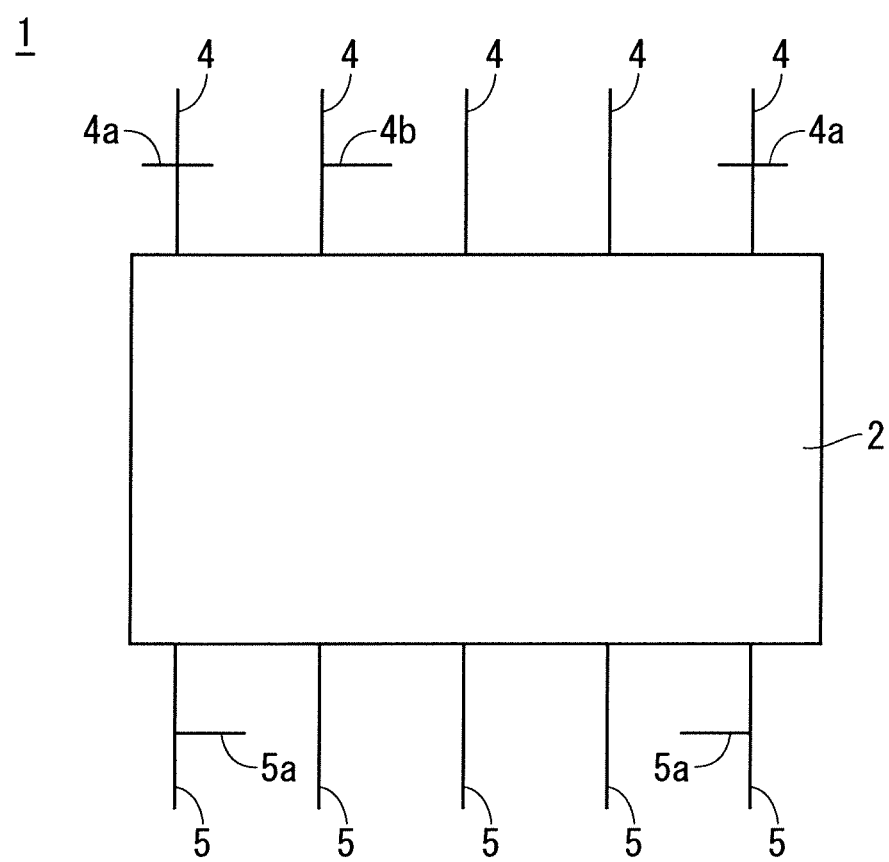
FIG. 3 is a plan view illustrating an other example of the semiconductor device according to the first embodiment before bending.
Figure 4:
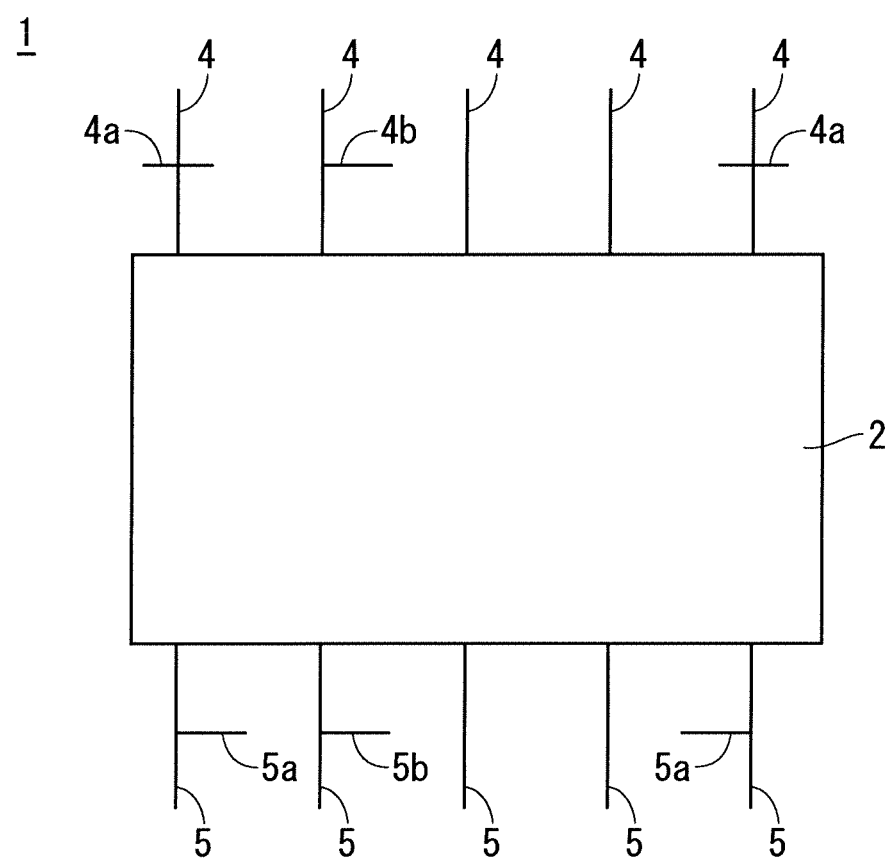
FIG. 4 is a plan view illustrating yet another example of the semiconductor device according to the first embodiment before bending.

FIG. 3 is a plan view illustrating an other example of the semiconductor device 1 according to the first embodiment before bending. FIG. 4 is a plan view illustrating yet another example of the semiconductor device 1 according to the first embodiment before bending.

As illustrated in FIG. 3, the stopper 4b as the second stopper projects from the middle portion of the control terminal 4 toward the adjacent control terminal 4. Also, as illustrated in FIG. 4, the stopper 4b as the second stopper protrudes from the middle portion of the control terminal 4 toward the adjacent control terminal 4, and the stopper 5b as the second stopper is protrudes from the middle portion of the main terminal 5 toward the adjacent main terminal 5.

Effect

Next, the effect of the semiconductor device 1 according to the first embodiment will be described in comparison with the conventional configuration in which the second stopper is not provided.

Conventionally, identification of the rated current of the semiconductor device 1 has required confirmation of the product model name 10 (see FIG. 1) printed on the bottom surface of the package 2. The bottom surface of the package 2 is in contact with the substrate 50 when the semiconductor device 1 is mounted on the substrate 50; therefore, removal of the semiconductor device 1 from the substrate 50 has been required in order to confirm the model name after mounting the semiconductor device 1. In particular, when the outer shapes of a plurality of semiconductor devices 1 are the same and only the rated currents are different, identifying the rated current by visually inspecting the outer shape is difficult. Therefore, identifying the rated current involves the above-mentioned removal work, causing a concern that the production efficiency may be lowered.

Whereas in the first embodiment, the semiconductor device 1, the semiconductor device 1 being mounted on the substrate 50, includes the package 2 sealing the semiconductor element and having a rectangular shape in top view, the control terminal group including at least three control terminals 4 inputting a control signal to the semiconductor element and projecting from a side surface of a first side out of the first side and the second side opposite to the first side of the package 2, and the main terminal group including at least three main terminals 5 energizing the semiconductor element with the main current and projecting from the side surface of the second side, in which, the middle portions of the two respective terminals 4 and 5 of the control terminal group and the main terminal group are provided with the stoppers 4a and 5a for preventing over-insertion into the substrate 50, and the middle portion of at least one terminal 4, 5 of at least any one of the terminal groups of the control terminal group and the main terminal group is provided with the stoppers 4b, 5b for identifying the rated current of the semiconductor device 1.

Specifically, the stopper 4b is provided on at least one control terminal 4 to which the stopper 4a is not provided. Alternatively, the stopper 5b is provided on at least one main terminal 5 to which the stopper 5a is not provided.

Therefore, facilitated identification of the rated current of the semiconductor device 1 is ensured without removing the semiconductor device 1 from the substrate 50 by making the number of stoppers 4b and 5b different for each rated current of the semiconductor device 1.

Although not illustrated, when the stoppers 4b and 5b are not provided, the identification of the rated current of the semiconductor device 1 is ensured by providing an opening hole in the substrate 50 through which the product model name 10 is visually inspected, however, this takes processing man-hours to provide the opening hole in the substrate 50. In the first embodiment, forming an opening hole in the substrate 50 is not required; therefore, such an increase in processing man-hours is suppressed.

Specifically, the stoppers 5b and 4b are provided on at least one main terminal 5 to which the stopper 5a is not provided and at least one control terminal 4 to which the stopper 4a is not provided. Therefore, facilitated identification of the rated current of the semiconductor device 1 is ensured without removing the semiconductor device 1 from the substrate 50. This allows visual inspection from both the main terminal 5 side and the control terminal 4 side and visibility of the stoppers 5b and 4b is improved as compared with the case where the stoppers 5b and 4b are provided only on one of the main terminal 5 and the control terminal 4.

Second Embodiment

Figure 6:
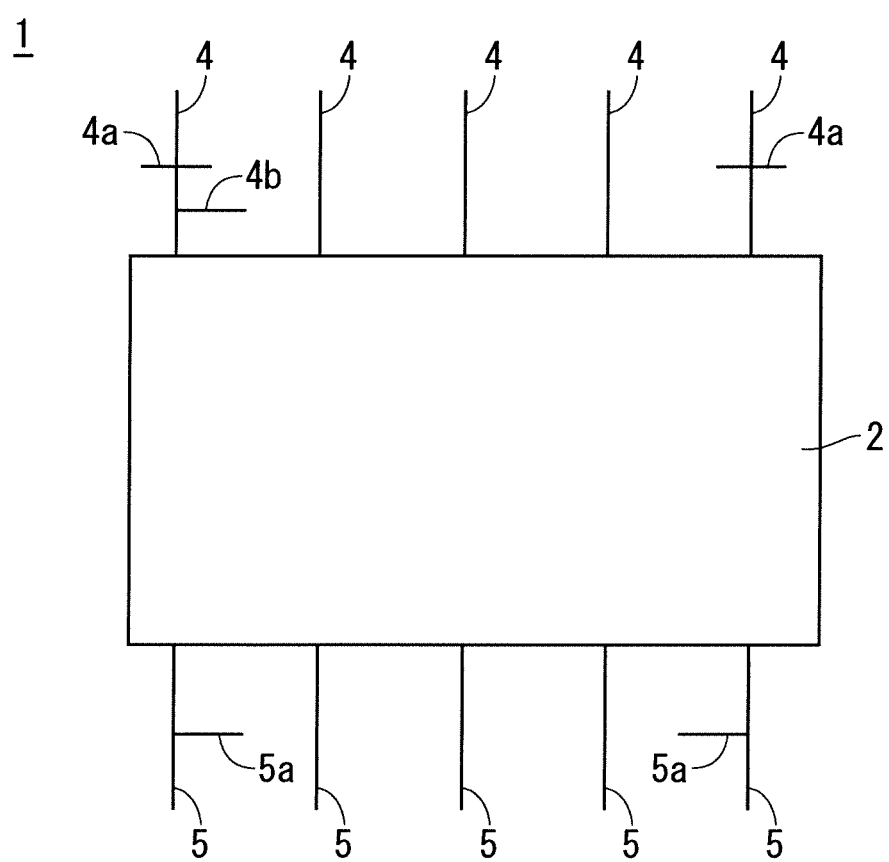
FIG. 6 is a plan view illustrating an other example of the semiconductor device according to the second embodiment before bending.

Next, the semiconductor device according to the second embodiment will be described. FIG. 5 is a plan view illustrating an example of the semiconductor device 1 according to a second embodiment before bending. FIG. 6 is a plan view illustrating an other example of the semiconductor device 1 according to the second embodiment before bending. FIG. 7 is a plan view illustrating yet another example of the semiconductor device 1 according to the second embodiment before bending. It should be noted that, in the second embodiment, the description of the same components as those described in the first embodiment will be omitted here.

As illustrated in FIG. 5, in the second embodiment, a stopper 5b is provided between a base end portion of the main terminal 5 provided with a stopper 5a and the stopper 5a provided on the main terminal 5. The stopper 5b projects in the same direction as the stopper 5a provided on the main terminal 5 projects. In FIG. 5, although the stopper 5b is provided on one main terminal 5 provided with the stopper 5a, the stoppers 5b may be provided on the two main terminals 5 provided with the stoppers 5a.

Further, as illustrated in FIG. 6, the stopper 4b may be provided not on the main terminal 5 but on the control terminal 4 provided with the stopper 4a. The stopper 4b is provided between the base end portion of the control terminal 4 and the stopper 4a provided on the control terminal 4, and projects from the control terminal 4 toward the adjacent control terminal 4. In FIG. 6, although the stopper 4b is provided on one control terminal 4 provided with the stopper 4a, the stoppers 4b may be provided on the two control terminals 4 provided with the stoppers 4a.

Further, as illustrated in FIG. 7, the stoppers 5b and 4b may be provided on the main terminal 5 provided with the stopper 5a and the control terminal 4 provided with the stoppers 4a, respectively.

As described above, in the semiconductor device 1 according to the second embodiment, the stopper 5b is provided on the main terminal 5 provided with the stopper 5a. Alternatively, the stopper 4b is provided on the control terminal 4 provided with the stopper 4a. Therefore, facilitated identification of the rated current of the semiconductor device 1 is ensured without removing the semiconductor device 1 from the substrate 50. Further, the rated current of the semiconductor device 1 is identified by visually inspecting the main terminal 5 provided with the stopper 5a or the control terminal 4 provided with the stopper 4a alone without visually inspecting the plurality of main terminals 5 or the control terminals 4.

Also, the stoppers 5b and 4b are provided on the main terminal 5 provided with the stopper 5a and the main control terminal 4 provided with the stoppers 4a, respectively. Therefore, facilitated identification of the rated current of the semiconductor device 1 is ensured without removing the semiconductor device 1 from the substrate 50. This allows visual inspection from both the main terminal 5 side and the control terminal 4 side and visibility of the stoppers 5b and 4b is improved as compared with the case where the stoppers 5b and 4b are provided only on one of the main terminal 5 and the control terminal 4.

Third Embodiment

Figure 8:
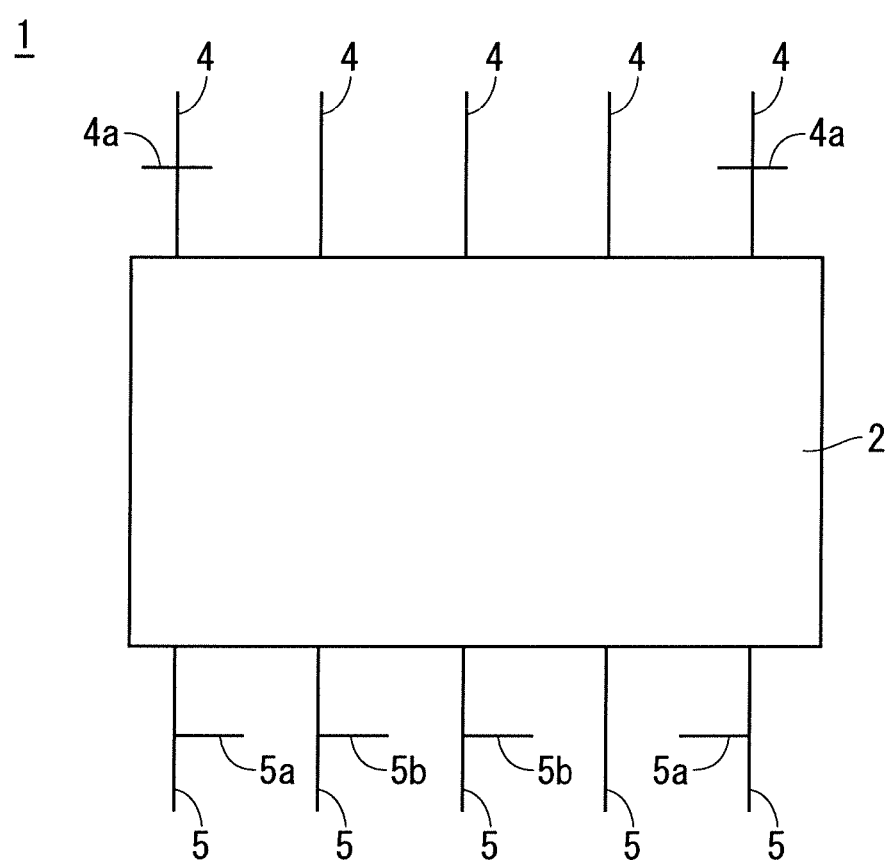
FIG. 8 is a plan view illustrating an example of a semiconductor device according to a third embodiment before bending.
Figure 9:
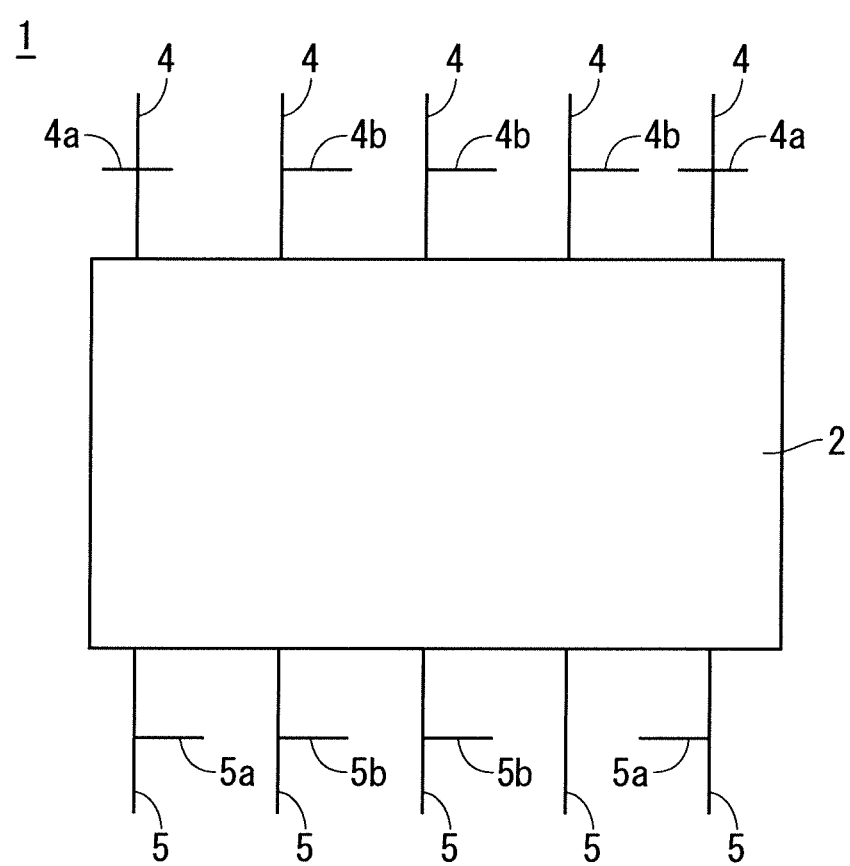
FIG. 9 is a plan view illustrating an other example of the semiconductor device according to the third embodiment before bending.

Next, the semiconductor device 1 according to a third embodiment will be described. FIG. 8 is a plan view illustrating an example of the semiconductor device 1 according to a third embodiment before bending. FIG. 9 is a plan view illustrating an other example of the semiconductor device 1 according to the third embodiment before bending. It should be noted that, in the third embodiment, the description of the same components as those described in the first and second embodiments will be omitted here.

As illustrated in FIG. 8, in the third embodiment, the configuration of the semiconductor device 1 is the same as that of the first embodiment, except that the number of stoppers 5a and 5b having the same protrusion direction for each rated current of the semiconductor device 1 is different. For example, in FIG. 8, when there are a total of three rightward stoppers 5a and 5b, this represents a 5 A rated product. When there are a total of four rightward stoppers 5a and 5b, this represents a 10 A rated product.

Further, although not illustrated, instead of the stoppers 5a and 5b, the number of stoppers 4a and 4b having the same protrusion direction may be different for each rated current of the semiconductor device 1, and as illustrated in FIG. 9, the number of stoppers 5a and 5b and stoppers 4a and 4b having the same protrusion direction may be different.

As described above, in the third embodiment, the same effect as that of the first embodiment can be obtained.

Fourth Embodiment

Figure 10:
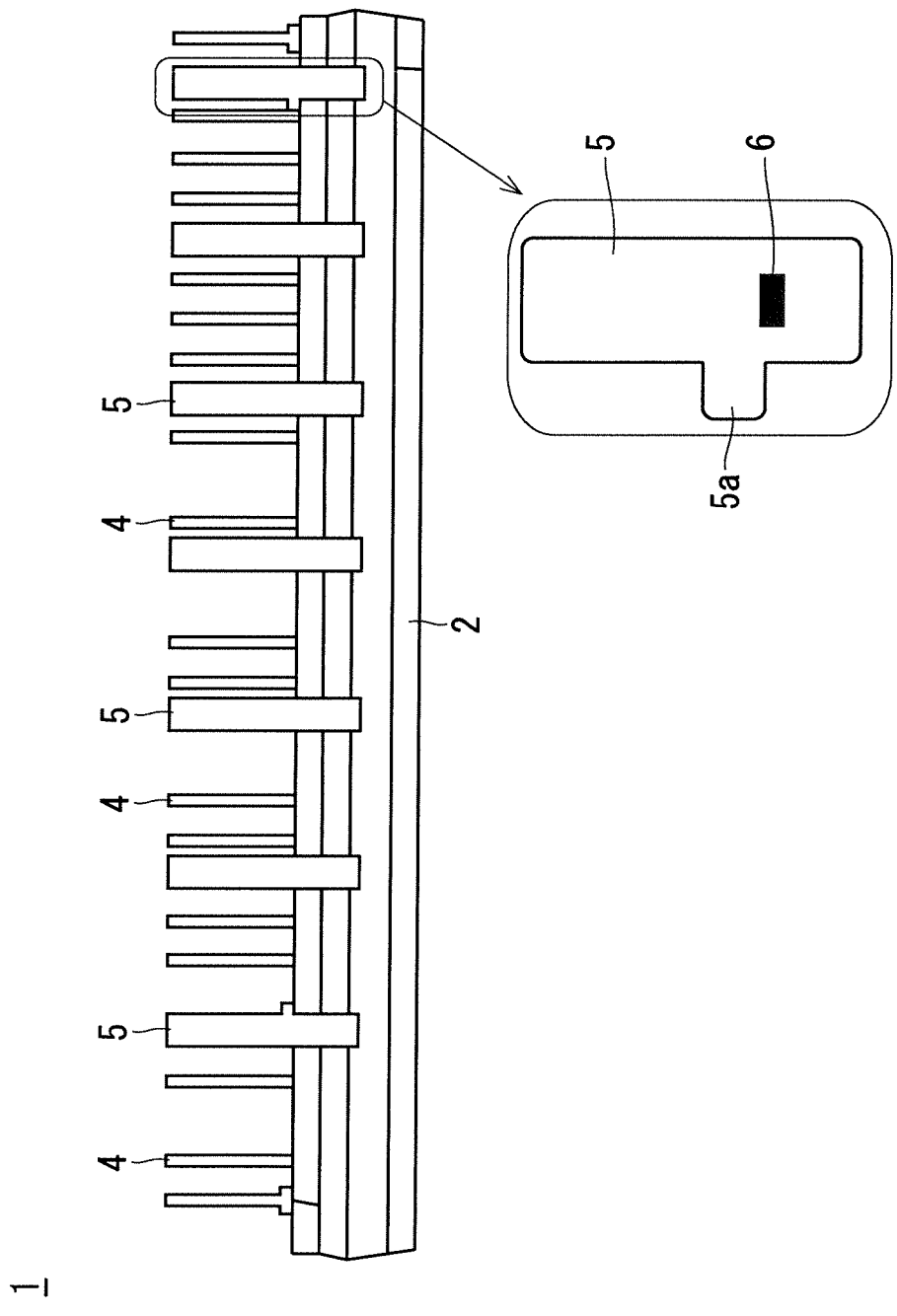
FIG. 10 is a side view illustrating an example of a semiconductor device according to a fourth embodiment.
Figure 11:
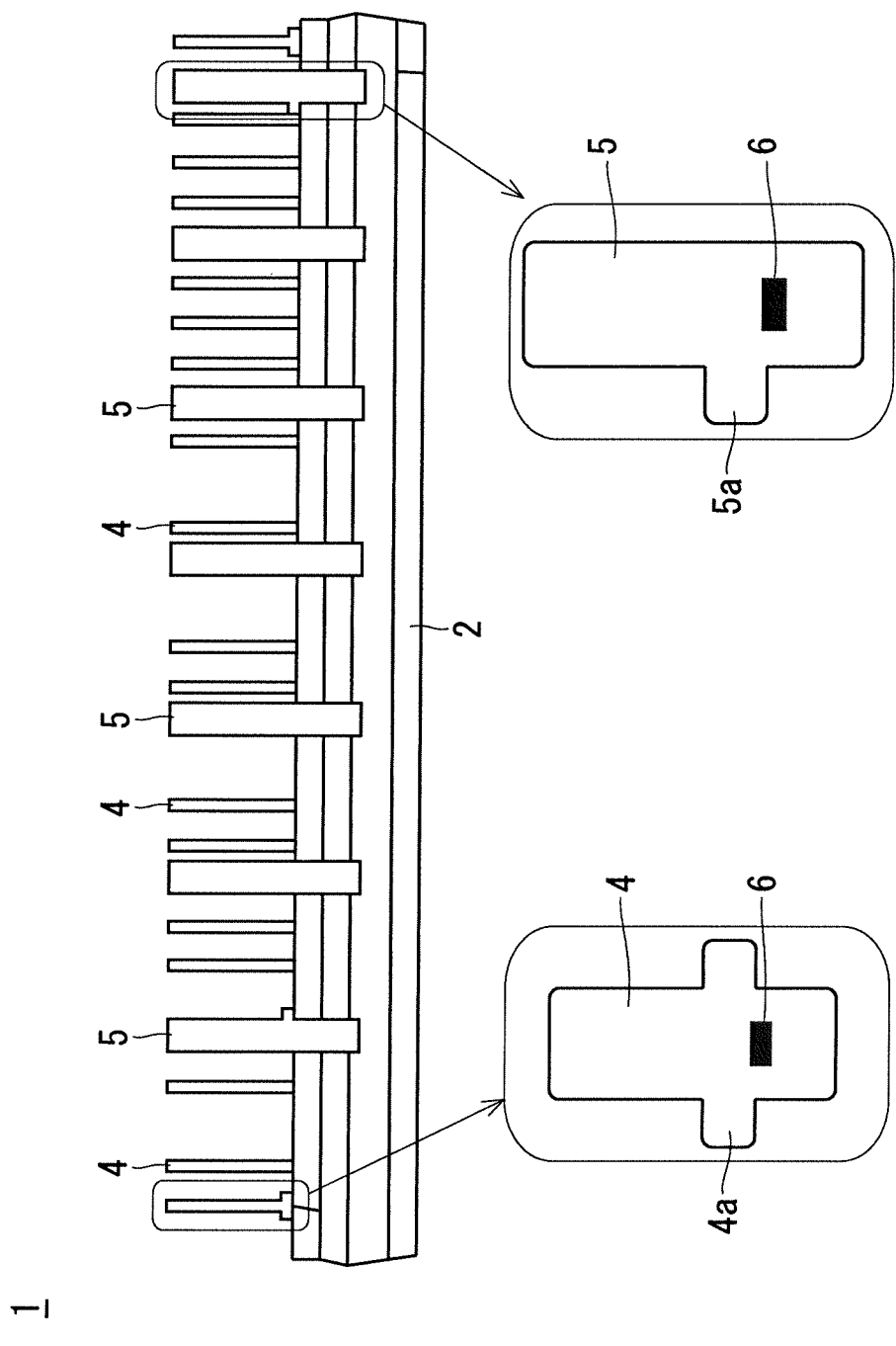
FIG. 11 is a side view illustrating an other example of the semiconductor device according to the fourth embodiment.

Next, the semiconductor device 1 according to a fourth embodiment will be described. FIG. 10 is a side view illustrating an example of a semiconductor device according to the fourth embodiment. FIG. 11 is a side view illustrating an example of a semiconductor device 1 according to the fourth embodiment. It should be noted that, in the fourth embodiment, the description of the same components as those described in the first to third embodiments will be omitted here.

As illustrated in FIG. 10, in the fourth embodiment, a symbol 6 for identifying the rated current is printed by the laser mark on one main terminal 5 provided with the stopper 5a. The tip of the main terminal 5 is inserted into a hole (not illustrated) of the substrate 50 (see FIG. 1); therefore, the symbol 6 is printed between the base end portion and the middle portion of the main terminal 5. For example, a bar, or "-", is used as a symbol, and a single bar symbol represents a 5 A rated product, and a double bar symbol represents a 10 A rated product.

Further, although not illustrated, instead of the main terminal 5, the symbol 6 for identifying the rated current may be printed on one control terminal 4 provided with the stopper 4a, and as illustrated in FIG. 11, the symbol 6 for identifying the rated current may be printed on one main terminal 5 provided with the stopper 5a and one control terminal 4 provided with the stopper 4a.

As described above, the semiconductor device 1 according to the fourth embodiment, the semiconductor device 1 being mounted on the substrate 50, includes the package 2 sealing the semiconductor element and having a rectangular shape in top view, the control terminal group including at least three control terminals 4 inputting a control signal to the semiconductor element and projecting from a side surface of a first side out of the first side and the second side opposite to the first side of the package 2, and the main terminal group including at least three main terminals 5 energizing the semiconductor element with the main current and projecting from the side surface of the second side, in which, the middle portions of the two respective terminals 4 and 5 of the control terminal group and the main terminal group are provided with the stoppers 4a and 5a for preventing over-insertion into the substrate 50 and between the base end portion and the middle portion of at least one of the terminals 4 and 5 of the main terminals 5 and the control terminals 4 to which the stoppers 4a and 5a are provided, a symbol 6 for identifying the rated current is printed.

Therefore, facilitated identification of the rated current of the semiconductor device 1 is ensured without removing the semiconductor device 1 from the substrate 50.

Further, the symbol 6 for identifying the rated current is printed between the base end portion and the intermediate portion of each terminal of both the main terminal 5 and the control terminal 4 provided with the stoppers 4a and 5a, respectively. Accordingly, this allows visual inspection from both the main terminal 5 side and the control terminal 4 side and visibility of the symbol 6 is improved as compared with the case where the symbol 6 is provided only on one of the main terminal 5 and the control terminal 4.

The embodiments can be combined, appropriately modified or omitted.

While the disclosure has been illustrated and described in detail, the foregoing description is in all aspects illustrative and not restrictive. It is therefore understood that numerous modifications and variations can be devised without departing from the scope of the invention.

What is claimed is:

1. A semiconductor device to be mounted on a substrate, comprising:
    a package sealing a semiconductor element and having a rectangular shape in top view;
    a control terminal group including at least three control terminals inputting a control signal to the semiconductor element and projecting from a side surface of a first side out of the first side and a second side opposite to the first side of the package; and
    a main terminal group including at least three main terminals energizing the semiconductor element with a main current and projecting from a side surface of the second side, wherein
    middle portions of the two respective terminals of the control terminal group and the main terminal group are provided with first stoppers for preventing over-insertion into the substrate, and
    a middle portion of at least one terminal of at least any one of the terminal groups of the control terminal group and the main terminal group is provided with a second stopper for identifying a rated current of the semiconductor device.

2. The semiconductor device according to claim 1, wherein
    the second stopper is provided on at least one of the main terminals to which the first stopper is not provided.

3. The semiconductor device according to claim 2, wherein
    the second stopper is provided on the main terminal provided with the first stopper.

4. The semiconductor device according to claim 1, wherein
    the second stopper is provided on at least one of the control terminals to which the first stopper is not provided.

5. The semiconductor device according to claim 4, wherein
    the second stopper is provided on the control terminal provided with the first stopper.

6. The semiconductor device according to claim 1, wherein
    the second stopper is provided on at least one of the main terminals to which the first stopper is not provided and at least one of the control terminals to which the first stopper is not provided.

7. The semiconductor device according to claim 4, wherein
    the second stopper is provided on the main terminal provided with the first stopper and the control terminal provided with the first stopper.

8. A semiconductor device to be mounted on a substrate, comprising:
    a package sealing a semiconductor element and having a rectangular shape in top view;
    a control terminal group including at least three control terminals inputting a control signal to the semiconductor element and projecting from a side surface of a first side out of the first side and a second side opposite to the first side of the package; and
    a main terminal group including at least three main terminals energizing the semiconductor element with a main current and projecting from a side surface of the second side, wherein
    middle portions of the two respective terminals of the control terminal group and the main terminal group are provided with stoppers for preventing over-insertion into the substrate and
    between a base end portion and a middle portion of at least one of the terminals of the main terminals and the control terminals to which the stoppers are provided, a symbol for identifying a rated current is printed.

9. The semiconductor device according to claim 8, wherein
    the symbol for identifying the rated current is printed between a base end portion and a middle portion of each terminal of both the main terminal and the control terminal provided with the stoppers, respectively.

* * * * *